(12) United States Patent
Song et al.

(10) Patent No.: US 9,606,154 B2
(45) Date of Patent: Mar. 28, 2017

(54) ELECTRICAL LOAD IDENTIFICATION DURING AN ON EVENT USING A SUPPORT VECTOR MACHINE CLASSIFIER

(71) Applicant: Intel Corporation, Santa Clara, CA (US)

(72) Inventors: James Y. Song, Portland, OR (US); Shiraz Saleem, Chandler, AZ (US); Tomm V. Aldridge, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 476 days.

(21) Appl. No.: 14/142,766

(22) Filed: Dec. 28, 2013

(65) Prior Publication Data

US 2015/0185262 A1   Jul. 2, 2015

(51) Int. Cl.
*G01R 19/00* (2006.01)
*G01R 21/133* (2006.01)
*G06N 99/00* (2010.01)
*G01R 19/25* (2006.01)

(52) U.S. Cl.
CPC ....... *G01R 21/133* (2013.01); *G01R 19/2513* (2013.01); *G06N 99/005* (2013.01)

(58) Field of Classification Search
CPC ........ G06N 99/005; G06N 3/08; G06N 5/045; G06N 5/047; G06N 7/005; G06F 17/5009; G06F 17/11; G06F 19/3406; G06F 19/3437; G06F 21/44; G06F 3/015; G06F 3/017; G06F 13/36; G06F 13/4022; G06F 13/406
See application file for complete search history.

(56) References Cited

U.S. PATENT DOCUMENTS

| | | | |
|---|---|---|---|
| 2011/0057518 A1* | 3/2011 | Gilbert | G06F 1/266 307/112 |
| 2011/0071694 A1* | 3/2011 | Mammone | G06Q 30/02 700/291 |

\* cited by examiner

*Primary Examiner* — Roy Y Yi
(74) *Attorney, Agent, or Firm* — Jordan IP Law, LLC

(57) ABSTRACT

Methods and systems may provide for identifying, and distinguishing between electrical loads using time and frequency domain analysis of at least one property of an alternating current during a transient event. In one example, time and frequency domain features may be computed from the voltage signatures of an ON event. A support vector machine classifier may then be trained using the feature vectors (including the time and frequency domain features) for known devices. The trained support vector machine may classify or identify an unknown electrical device using a feature vector as input.

24 Claims, 3 Drawing Sheets

ELECTRICAL LOAD IDENTIFICATION DURING AN ON EVENT USING A SUPPORT VECTOR MACHINE CLASSIFIER

BACKGROUND

Technical Field

Embodiments generally relate to load analysis in electrical systems. More particularly, embodiments relate to a support vector machine classifier which uses time and frequency domain features of a voltage signature during an ON event to identify and distinguish between electrical loads.

Discussion

Electrical load analysis may be used to monitor the operation of devices, appliances and equipment connected to the electrical systems of buildings, residences, and other facilities. Current sensing solutions may involve installing either a large current transformer in the main circuit breaker or numerous smaller in-line current sensors at the point of connection of each load to the system. Due to safety concerns, the large current transformer installation may require skilled electricians and a complete shutdown of the electrical system. Moreover, the in-line current sensor installations may be time consuming and costly, particularly if many loads are being monitored. While recent developments may have been made with regard to voltage monitoring of electrical loads, there remains considerable room for improvement. For example, conventional voltage sensing solutions may require complex frequency domain analysis (e.g., harmonics analysis at very high bit resolutions) in order to achieve reliable results. Further, conventional solutions may require the use of both voltage and current signatures in order to accurately classify devices.

BRIEF DESCRIPTION OF THE DRAWINGS

The various novel aspects of the embodiments of the present disclosure will become evident to a person of ordinary skill in the art given the following enabling specification and appended claims, and by referencing the following drawings, in which:

DETAILED DESCRIPTION OF THE DRAWINGS

Figure 1:
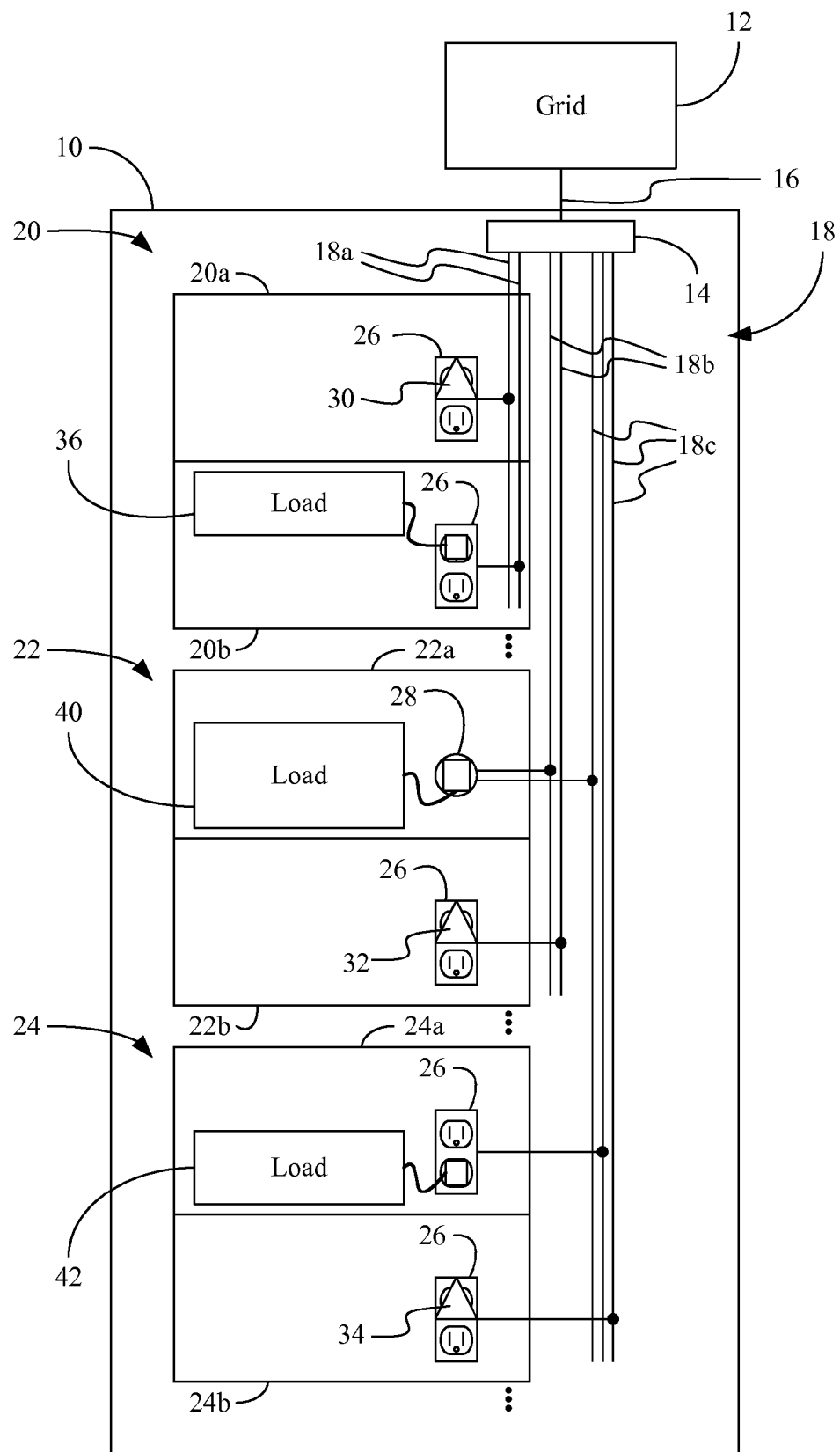
FIG. 1 shows an illustration of an example of a facility having an load identification system according to an embodiment.

FIG. 1 shows a facility 10 such as, for example, a building, residence or other area having an electrical system that is powered by an electrical grid 12 (e.g., utility, transmission lines, etc.). The illustrated facility 10 includes a main circuit breaker 14 that receives AC (alternating current) power from a main line 16 connected to the electrical grid 12 and provides that power to various locations of the facility 10 in the form of a plurality of voltage legs 18 (18a-18c). For example, outlets 26 (e.g., 120V receptacles) in a first set of rooms 20 (20a, 20b) of the facility 10 may receive a first leg 18a of the AC power. Additionally, an outlet 26 in a second set of rooms 22 (22a, 22b) of the facility 10 may receive a second leg 18b of the AC power, and an outlet 28 (e.g., 240V receptacle) in the second set of rooms 22 may receive the second leg 18b and a third leg 18c of the AC power. In addition, outlets 26 in a third set of rooms 24 (24a, 24b) of the facility 10 may receive the third leg 18c of the AC power.

The voltage legs 18 may be derived from a wide variety of 3-phase power supply configurations such as, for example, wye configurations (e.g., 208Y/120, 480Y/277, 208Y/120 5-wire), delta configurations (e.g., 3-wire delta, 4-wire delta, 240V split phase delta), and so forth. Although three legs 18 are shown, other distribution arrangements such as, for example, one leg arrangements (e.g., single phase 120Vac), two leg arrangements (e.g., single phase 120/240), may be used, depending upon the circumstances. Moreover, the voltage legs 18 need not be distributed on a room-by-room basis as shown. Neutral and/or ground connections are not shown to simplify the illustration.

In the illustrated example, a first voltage sensor 30 is plugged into the outlet 26 in the first set of rooms 20, wherein the first voltage sensor 30 generates a first set of voltage samples corresponding to the line voltage of the first leg 18a. Similarly, a second voltage sensor 32 may be plugged into the outlet 26 in the second set of rooms 22 to obtain a second set of voltage samples corresponding to the line voltage of the second leg 18b and a third voltage sensor 34 may be plugged into the outlet 26 in the third set of rooms 24 to obtain a third set of voltage samples corresponding to the line voltage of the third leg 18c.

As will be discussed in greater detail, filtering and transient (i.e., oscillation) detection may be conducted on the first set of voltage samples from the first voltage sensor 30, the second set of voltage samples from the second sensor 32 and/or the third set of voltage samples from the third voltage sensor 34. The process of filtering and transient detection on the raw voltage samples may yield synthesized and useful data of a reduced sample size, including, for example, an ON signature. Sending the synthesized data, as opposed to the raw voltage samples, simplifies the load identification and classification process (which is typically done on a device separate from the actual sensing). This in turn may also lead to reduced processing overhead, power consumption, network bandwidth usage, and so forth. The ON signature may include various features related to the electrical load of a device during an ON event (i.e., powering the device on). Time domain analysis and frequency domain analysis of the ON signature may enable identification of electrical system loads such as, for example, a load 36, a load 40, a load 42, etc. Moreover, the time domain analysis and frequency domain analysis may be used to distinguish two or more of the loads 36, 40, 42 from one another. In addition, using voltage sensors on a per leg basis may obviate safety concerns, reduce costs, eliminate installation related shutdowns, and so forth.

Figure 2:
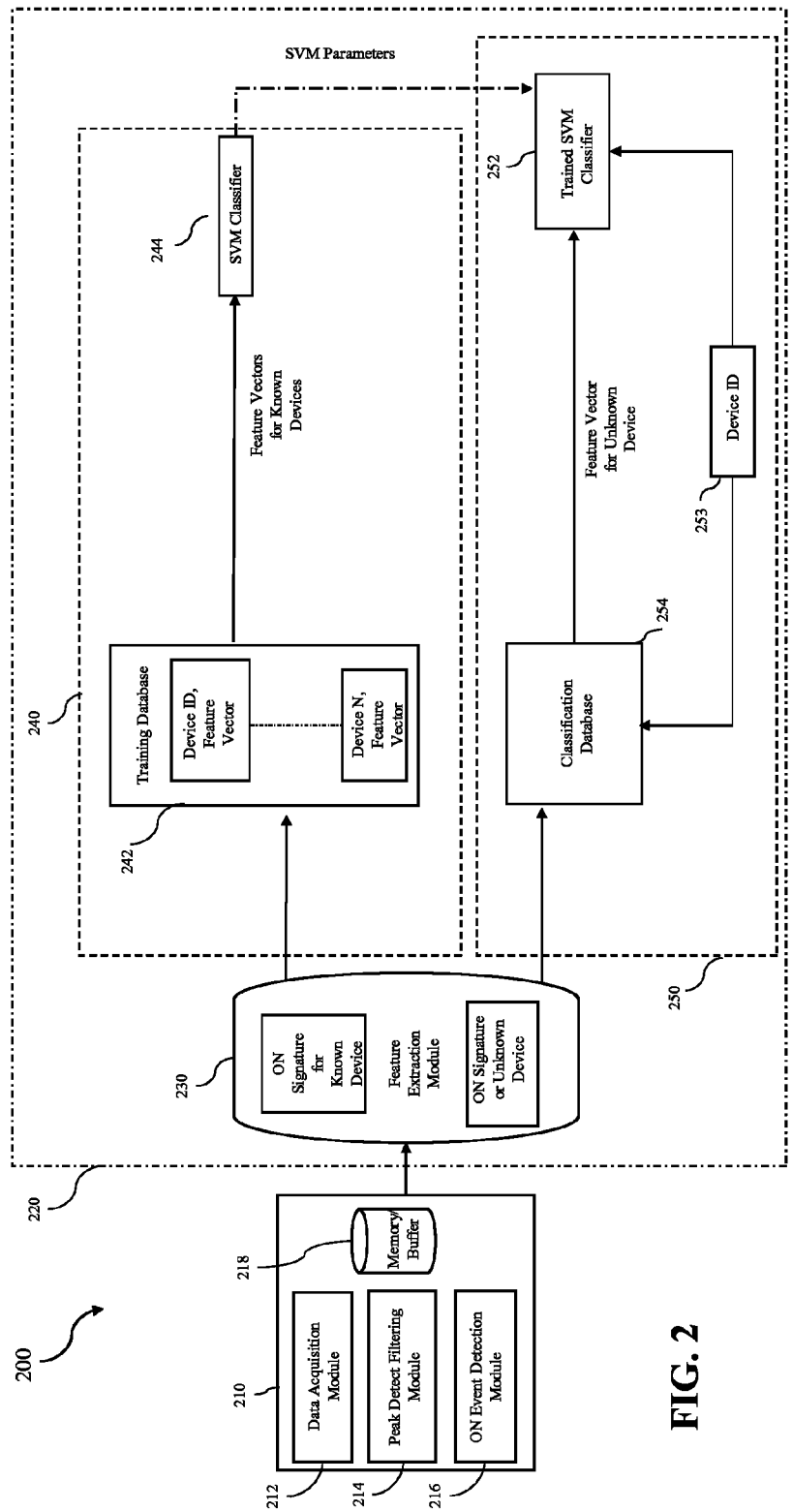
FIG. 2 is a block diagram of an electrical load identification system according to an embodiment.

FIG. 2 shows a block diagram of an electrical load identification system 200 according to an embodiment. The illustrated load identification system 200 includes a sensing module 210 and a computation module 220. The sensing module 210 may be in communication with an electrical sensor (not shown) coupled to a leg of an electrical system, and with the computation module 220. The sensing module 210 may also receive an electrical property (e.g., a line voltage) from the electrical sensor. In some examples, the electrical sensor may be integrated as part of the sensing module 210. In other examples, the electrical sensor may be a separate component in indirect communication (e.g., wireless) with the sensing module 210. The illustrated sensing module 210 includes a data acquisition module 212, a peak detect filtering module 214, and an "ON" event detection module 216. The computation module 220 may include a feature extraction module 230, a training module 240, and a classification module 250. The training module 240 may include a training database module 242 and a support vector machine (SVM) classifier 244. The classification module 250 may include a trained SVM classifier and a classification database 254. In some examples, the system 200 may relate to energy efficiency management systems, smart home systems, smart grid systems, and the like.

The data acquisition module 212 may include an integrated electrical sensor (e.g., a voltage sensor) or receive an input signal from a separate electrical sensor, as discussed above. The data acquisition module 212 captures an alternating current (AC) line voltage signal (e.g., 120 V, 60 Hz) represented as an amplitude modulated waveform (e.g., a sine wave). The waveform may be captured using, for example, a 10-bit analog-to-digital converter (ADC) at a sampling rate of 4 kHz. The captured data may be stored in a memory or buffer 218 (e.g., a 40 KB buffer). The peak detect filtering module 214 may compute the peak-to-peak voltage values of the positive and negative amplitudes of the raw input waveform of the alternating current line voltage signal stored in the buffer 218.

The "ON" event detection module 216 may monitor the peak-to-peak voltage values in sampling windows of a particular size (e.g., 4096 samples), to detect a transient event. The transient event may contain a region of samples useful for load identification and may be associated in this context with turning or powering a device "ON". The ON event detection module 216 may locate the transient event, for example, when the Euclidean distance from the maximum peak-to-peak value exceeds a predetermined threshold. The ON event detection module 216 may then define a window of samples (e.g., 4096 samples) of the peak-to-peak voltage values centered on the transient. This becomes the ON signature indicative of an ON event for an associated device. The ON signature may include frequency domain features (e.g., peak amplitude of harmonics) and time domain features (e.g., mean and variance of peak-to-peak voltage over time) that may be unique for certain devices. These frequency domain features and time domain features may be good candidates for the feature vector of the support vector machine (SVM) classifier 244.

The computation module 220 may receive an input including, for example, an ON signature or transient voltage signature from the sensing module 210. In some examples, the computation module 220 may perform training (via the training module 240) and classification (via the classification module 250). A training phase may be performed on the computation module 220 using ON signatures of "known" devices as inputs. During the training phase, feature vectors including time and frequency domain features for the "known" devices may be used as training data to a support vector machine (SVM) classifier 244. The training phase may yield a trained SVM classifier 252 having a tuned set of parameters or coefficients. In some embodiments, the training phase may be followed by a classification phase for the computation module 220. During the classification phase, the ON signature of "unknown" or "to be identified" devices may be provided as inputs to the computation module 220. The feature vectors for the "unknown" devices may be provided as inputs to the trained SVM classifier 252. The trained SVM classifier 252 may output a device ID 253 that may classify or identify the "unknown" device.

The feature extraction module 230 may compute a feature set (or feature vector) based on the ON signature of a device. The feature set may include frequency domain features and time domain features. The peak amplitude of harmonics (derived, by using a Fast Fourier Transform (FFT) on the ON signature) may be the frequency domain feature. The mean and variance of the peak-to-peak voltage over time may be the time domain feature.

The training module 240 may include a training database module 242 and a (untrained) SVM classifier 244. The feature sets and device IDs associated with "known" devices may be stored in the training database module 242 as associated sets for different devices (i.e., the feature set and associated device ID are stored together for each different device). The feature sets or vectors for "known" devices may then be transmitted to the untrained SVM classifier 244 as training data. The SVM classifier 244 may generate a weighted equation of the feature vectors that attempts to delineate the devices from each other. The SVM classifier 244 may utilize, for example, a radial basis function (RBF) kernel to enable the machine learning functions of the module. The volume of training data (i.e., the feature vectors of known devices) used and the feature vector chosen may influence how the SVM classifier 244 lands on the optimal weights/coefficients/parameters that improve the accuracy of the classification. A trained SVM classifier 252 may be derived after the training phase which is input to the classification module 250.

The classification module 250 may include a trained SVM classifier 252 and a classification database 254. The classification database 254 may receive and store the feature vectors for "unknown" devices (derived from the feature extraction module 230) for further processing in order to determine the identity or class of the device. A feature vector for an "unknown" device may be transmitted to the trained SVM classifier 252. This feature vector may be used in the weighted equation of the trained SVM classifier to output a corresponding device ID 253 for the "unknown" device. The device ID 253 may be fed back into the classification database 254 to replace the "unknown device" tag with device ID 253. The system 200 may therefore be used to identify or classify electrical devices based on time domain analysis and frequency domain analysis of the voltage signatures of the devices during an "ON" event. In some examples, for instance, the system 200 may yield an accuracy of 97% or more for the classification, when mean and variance of peak-to-peak voltage over time, and peak amplitude of odd harmonics are used as feature vectors for the SVM. The system 200 may also be used to quickly, efficiently, and accurately identify a device that turned ON.

Figure 3:
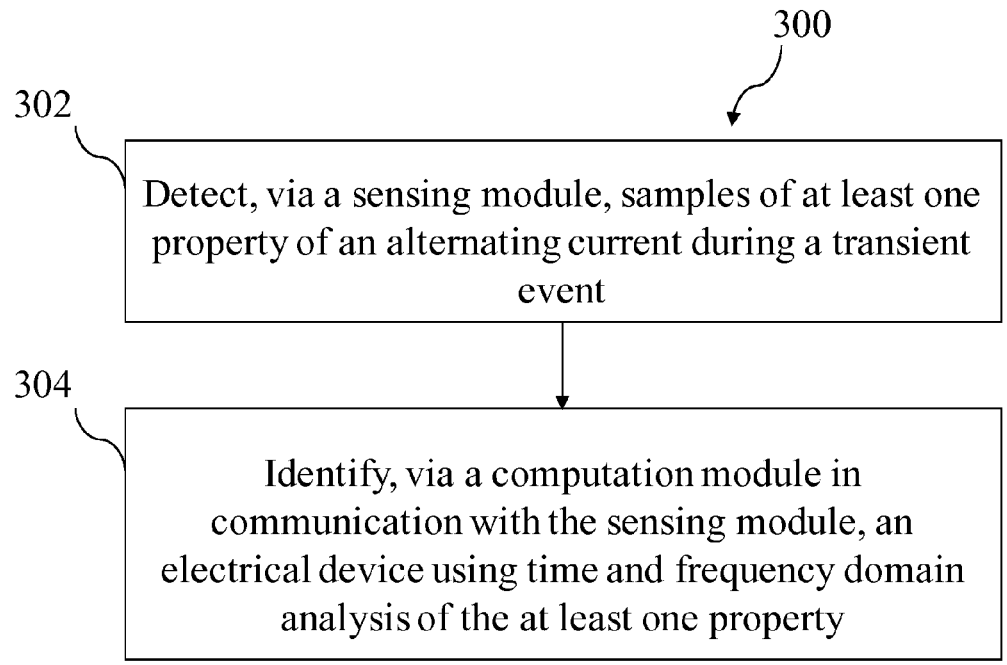
FIG. 3 is a flowchart of an example of a method of identifying electrical loads according to an embodiment.

FIG. 3 shows a method 300 of identifying electrical loads. The method 300 may be implemented via a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality logic hardware using circuit technology such as, for example, application specific integrated circuit (ASIC), complementary metal oxide semiconductor (CMOS) or transistor-transistor logic (TTL) technology, or any combination thereof.

Illustrated processing block 302 provides for detecting samples of at least one property of an alternating current during a transient event. In some examples, the at least one property of an alternating current is line voltage for a leg in an electrical system. The line voltage may be received from, for example, a voltage sensor plugged into an outlet connected to the leg. The samples may be obtained from an amplitude modulated line voltage waveform (e.g., 120 Hz, 100 Hz sine wave) at a sampling rate of, for example, 4.8 KHz. Peak-to-peak filtering and transient event detection may be conducted on the set of voltage samples to locate the voltage signature corresponding to a transient event, including, for example an ON-event signature. In general, complex loads with predictable state changes may impact the peak-to-peak amplitude of the sampled waveform at particular time intervals. Storing these state changes and understanding the predicted behaviors of these state changes in the time domain may increase the ability to identify transient events. Furthermore, using multiple, simultaneous views of the peak-to-peak amplitude changes (e.g., per voltage leg) in a particular time period may aid in the identification of the event. Time domain analysis and frequency domain analysis on transient event samples of the at least one property of the alternating current at block 304 may allow an electrical device to be identified.

Certain features such as, for example, transient amplitude, transient duration, cross correlation, shape magnitude, run delta, number of legs, standard deviation, and the like, tend to be unique for certain devices. For example, loads such as an HVAC (heating, ventilation, air conditioning) compressor, a two stage resistive load (e.g., an oven with multiple heating elements), a resistive and inductive load (e.g., a clothes dryer), and a refrigeration load may be characterized in terms of transient amplitude, transient duration, transient shape, and the number of legs involved. Thus, these features may be good candidates for the formulation of the feature vector of the SVM classifier as they may improve the accuracy of classification of the devices by allowing for the optimal weights/coefficients/parameters to be used by the SVM classifier 244, as already discussed. Some of these features are discussed below.

Transient Amplitude

When a load activates (e.g., turns on), a brief disturbance (e.g., transient) in the line voltage may occur. The amplitude of that disturbance may be quantified and used as a feature to compare voltage samples for a detected event to known voltage signatures for particular loads. For example, the transient amplitude for an HVAC compressor is relatively large and the transient amplitudes for a two stage resistive load and a resistive/inductive load are relatively small.

Transient Duration

The duration of the line voltage disturbance may also be quantified and used as a feature to compare voltage samples for a detected event to known voltage signatures for particular loads. As an example, the transient duration for a two stage resistive load may be relatively long and the transient duration for a resistive/inductive load may be relatively short.

Cross Correlation

The shape of the line voltage event may be quantified in a number of different ways. In one approach, a cross correlation may be determined by normalizing the voltage samples for the detected event and determining the difference (e.g., Euclidean distance) between the normalized samples and line voltage signatures for known loads. The cross correlation may therefore provide a comparison between the shape of the event and the shape of the signature. Thus, two line voltage disturbances having the same shape but different magnitudes may result in a relatively high match probability under the cross correlation feature. In this regard, the cross correlation may be independent of the physical location of the line voltage sensors within the facility (e.g., connected outlet position relative to the loads).

Shape Magnitude

Another approach to quantifying the shape of a line voltage event may be to determine the shape magnitude, which may indicate the difference (e.g., Euclidean distance) between non-normalized voltage samples for the detected event and line voltage signatures for known loads. The shape magnitude may therefore provide a comparison between the absolute values of the event shape and the signature shape. Thus, two line voltage disturbances having the same shape but different magnitudes may result in a relatively low match probability under the shape magnitude feature. In this regard, the shape magnitude may be a function of the physical location of the line voltage sensors within the facility (e.g., connected outlet position relative to the loads).

Run Delta

Run Delta may provide a line voltage signature shape for an electrical device (e.g., an HVAC compressor) that may be useful in identifying a device under load. The difference between a pre-event line voltage and the steady state line voltage after the load has turned on may represent a run delta ($\Delta_r$) feature. The run delta feature may therefore be used to compare the voltage samples for a detected event to known voltage signatures for particular loads.

Number of Legs

The number of legs impacted by the load may also be used as a comparison feature. For example, a load that is connected to a single voltage leg (e.g., single phase compressor) in a two-leg configuration might cause a disturbance on both legs—a primary disturbance on the connected leg and a reflection on the non-connected leg—wherein the two disturbances may be different from one another in terms of shape magnitude, transient amplitude, transient duration, etc. In such a case, both disturbances may be used as signatures for the load in question. Split phase loads (e.g., central air conditioners), on the other hand, may have similar disturbances on both legs.

Standard Deviation

In addition, the standard deviation may be determined for the voltage samples and the known voltage signatures. In such an approach, the amount of variation from the average line voltage during the disturbance may provide a useful metric for identifying load. For example, the standard deviation for an HVAC compressor may be relatively large and the standard deviation for the two stage resistive load may be relatively small.

Figure 4:
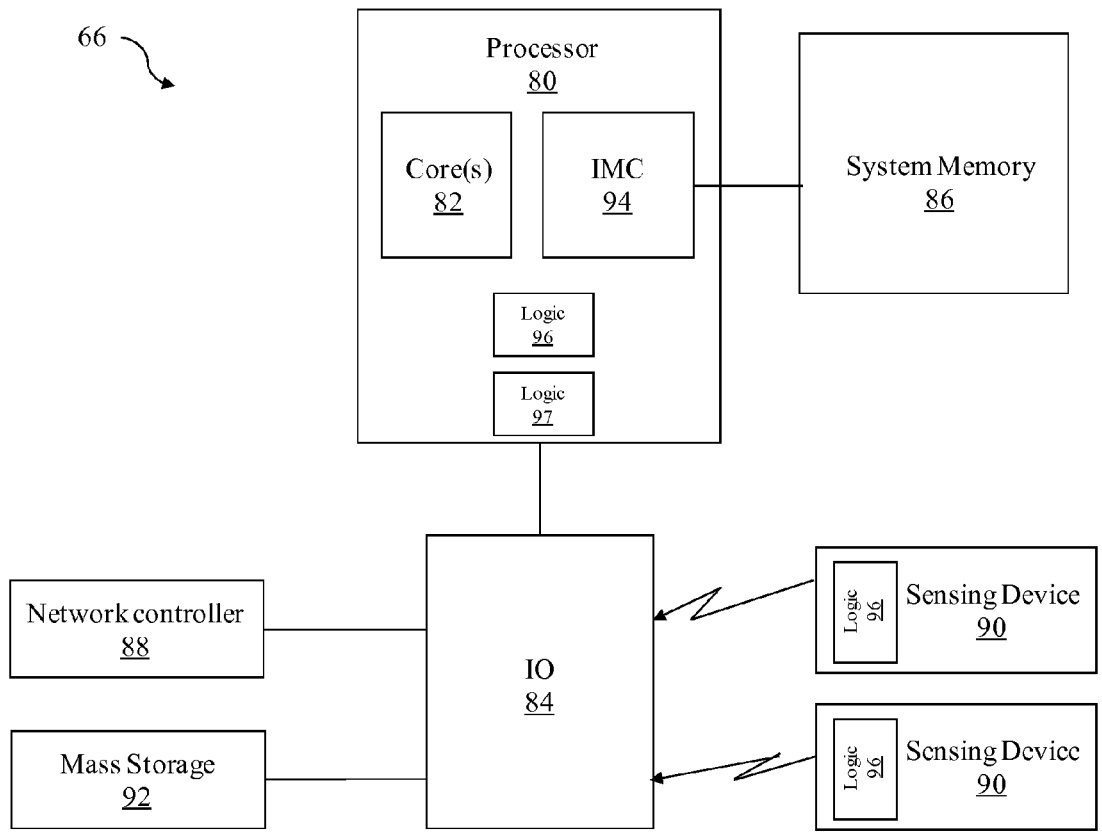
FIG. 4 is a block diagram of an example of an electrical load identification system according to an embodiment.

Turning now to FIG. 4, a computing platform 66 is shown. The platform 66 may be part of a device having computing functionality (e.g., personal digital assistant/PDA, notebook computer, tablet computer, convertible tablet, desktop computer, cloud server), communications functionality (e.g., wireless smart phone), imaging functionality, media playing functionality (e.g., smart television/TV), or any combination thereof (e.g., mobile Internet device/MID). In the illustrated example, the platform 66 includes a processor 80, an integrated memory controller (IMC) 94, an input output (IO) module 84, system memory 86, a network controller 88, one or more sensing devices 90 and mass storage 92 (e.g., optical disk, hard disk drive/HDD, flash memory). In one example, the sensing devices 90 may be a line voltage sensor capable of capturing raw voltage samples. In another example, the sensing devices 90 may be an integrated device capable of sensing and performing event detection. The platform 66 may function as a load identification system such as, for example, the load classification system 200 (FIG. 2).

The processor 80 may include a core region with one or several processor cores 82. The illustrated IO module 84, sometimes referred to as a Southbridge or South Complex of a chipset, functions as a host controller and communicates with the network controller 88, which could provide off-platform communication functionality for a wide variety of purposes such as, for example, cellular telephone (e.g., Wideband Code Division Multiple Access/W-CDMA (Universal Mobile Telecommunications System/UMTS), CDMA2000 (IS-856/IS-2000), etc.), WiFi (Wireless Fidelity, e.g., Institute of Electrical and Electronics Engineers/IEEE 802.11-2007, Wireless Local Area Network/LAN Medium Access Control (MAC) and Physical Layer (PHY) Specifications), 4G LTE (Fourth Generation Long Term Evolution), Bluetooth (e.g., IEEE 802.15.1-2005, Wireless Personal Area Networks), WiMax (e.g., IEEE 802.16-2004, LAN/MAN Broadband Wireless LANS), Global Positioning System (GPS), spread spectrum (e.g., 900 MHz), and other radio frequency (RF) telephony purposes. Other standards and/or technologies may also be implemented in the network controller 88, which may communicate wirelessly with the sensing devices 90. In some examples, the IO module 84 may include an analog-to-digital converter (ADC). The IO module 84 may also include one or more wireless hardware circuit blocks to support such functionality. Although the processor 80 and IO module 84 are illustrated as separate blocks, the processor 80 and IO module 84 may be implemented as a system on chip (SoC) on the same semiconductor die.

The system memory 86 may include, for example, double data rate (DDR) synchronous dynamic random access memory (SDRAM, e.g., DDR3 SDRAM JEDEC Standard JESD79-3C, April 2008) modules. The modules of the system memory 86 may be incorporated into a single inline memory module (SIMM), dual inline memory module (DIMM), small outline DIMM (SODIMM), and so forth.

The illustrated IO module 84 can receive samples corresponding to at least one property of an alternating current of a leg in an electrical system. Filtering and event detection, i.e. logic 96, can be performed by the sensing devices 90, or it can be performed by the processor 80. Processor 80 including core(s) 82 and IMC 94 may then perform the software analytics, i.e. logic 97, on the ON event samples of this property to identify an electrical device. The logic 96 and logic 97 may therefore function similarly to the logic of the electrical load identification system 200 (FIG. 2) and/or may implement one or more aspects of the method 300 (FIG. 2), already discussed.

Additional Notes and Examples

Example 1 may include a system for identifying an electrical device during an ON event, having a sensor, a sensing module, and a computation module. The sensor may be coupled to a leg in an electrical system to capture samples corresponding to at least one property of an alternating current. The sensing module may be in communication with the sensor to detect samples of the at least one property of the alternating current during an ON event. The computation module may be in communication with the sensing module to identify an electrical device using time domain and frequency analysis of the at least one property.

Example 2 may include the system of example 1, wherein the sensing module includes a data acquisition module, a peak detect filtering module, and an event detection module.

Example 3 may include the system of example 2, wherein the data acquisition module is to capture an alternating current line voltage signal and perform an analog-to-digital conversion of the signal.

Example 4 may include the system of example 2, wherein the peak detect filtering module is to compute a peak-to-peak voltage of the alternating current.

Example 5 may include the system of example 2, wherein the event detection module is to detect the ON event of the electrical device.

Example 6 may include the system of example 1, wherein the computation module includes a feature extraction module, a training module, and a classification module. The training module may have a training database module and a support vector machine classifier. The classification module may have a trained support vector machine classifier and a classification database.

Example 7 may include the system of example 6, wherein the feature extraction module is to compute a feature vector including frequency domain features and time domain features.

Example 8 may include the system of example 6, wherein the training module is to train the support vector machine classifier.

Example 9 may include the system of example 8, wherein the training module uses a database of feature vectors for known devices to perform the training.

Example 10 may include the system of example 6, wherein the classification module maintains a database to receive and store feature vectors for unknown devices.

Example 11 may include the system of example 10, wherein the classification module uses a trained support vector machine classifier to perform the identifying of unknown devices using a feature vector as input.

Example 12 may include a method for identifying an electrical device, including capturing samples of at least one property of an alternating current during a transient event, and identifying an electrical device using time and frequency domain analysis of the at least one property. The detecting may be performed via a sensing module. The identifying may be performed via a computation module in communication with the sensing module.

Example 13 may include the example of example 12, including capturing a line voltage signal of the alternating current and performing an analog-to-digital conversion of the signal, computing a peak-to-peak voltage of the alternating current, and detecting the transient event of the electrical device. The line voltage signal may be captured and converted via a data acquisition module. The peak-to-peak voltage may be computed via a peak detect filtering module. The transient event may be detected via an event detection module.

Example 14 may include the example of example 12, including computing a feature vector including frequency domain features and time domain features, training a support vector machine classifier, and identifying an unknown electrical device. The feature vector may be computed via a feature extraction module. The support vector machine classifier may be trained via a training module having a training database module and a support vector machine classifier.

Example 15 may include the example of example 14, wherein the training module uses a database of feature vectors for known devices to perform the training.

Example 16 may include the example of example 14, wherein the classification module uses the trained support vector machine classifier to perform the identifying of unknown devices using a feature vector as input.

Example 17 may include at least one computer readable storage medium having a set of instructions which, if executed by a computing system, cause the computing system to issue commands to a processor. The processor may detect samples of at least one property of an alternating current during an ON event, and identify an electrical device using time domain and frequency domain analysis of the at least one property.

Example 18 may include at least one computer readable storage medium of example 17, wherein the instructions, if executed, further cause a computing system to capture an alternating current line voltage signal and perform an analog-to-digital conversion of the signal, and detect an ON event of the electrical device.

Example 19 may include at least one computer readable storage medium of example 17, wherein the instructions, if executed, further cause a computing system to compute a feature set for the electrical device including frequency domain features and time domain features, train a support vector machine classifier, and identify an unknown electrical device using a trained support vector machine classifier.

Example 20 may include an apparatus for identifying an electrical device during an ON event, having a sensing module and a computing module in communication with the sensing module. The sensing module is to detect samples corresponding to at least one property of an alternating current of a leg in an electrical system during an ON event. The computation module is to identify an electrical device by time domain analysis and frequency domain analysis of the at least one property.

Example 21 may include the apparatus of example 20, wherein the sensing module includes a data acquisition module, a peak detect filtering module, and an event detection module.

Example 22 may include the apparatus of example 21, wherein the data acquisition module is to capture a line voltage signal of an alternating current and perform an analog-to-digital conversion of the signal. The peak detect filtering module is to compute a peak-to-peak voltage of the alternating current. The event detection module is to detect the ON event of the electrical device.

Example 23 may include the apparatus of example 20, wherein the computation module includes a feature extraction module, a training module having a training database module and a support vector classifier, and a classification module having a trained support vector machine classifier and a classification database.

Example 24 may include the apparatus of example 23, wherein the feature extraction module is to compute a feature vector including frequency domain features and time domain features. The training module is to train the support vector machine classifier. The classification module is to identify an unknown electrical device using the trained support vector machine classifier.

Thus, techniques described herein may provide the ability to accurately classify devices based on an ON voltage signature without the need for relatively large time windows and/or data sets. In one example, classification logic resident on a dashboard may identify which devices have turned on in a facility based on a signature analysis of voltage data streamed from only a few sensors coupled to outlets in the facility.

Embodiments of the present invention are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments of the present invention are not limited to the same. As manufacturing techniques (e.g., photolithography) evolve over time, it is expected that devices of smaller size could be manufactured. In addition, well known power/ground connections to IC chips and other components may or may not be shown within the figures, for simplicity of illustration and discussion, and so as not to obscure certain aspects of the embodiments of the invention. Further, arrangements may be shown in block diagram form in order to avoid obscuring embodiments of the invention, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments of the invention, it should be apparent to one skilled in the art that embodiments of the invention can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

We claim:
1. A system, comprising:
a sensor coupled to a leg in an electrical system, the sensor to generate samples corresponding to at least one property of an alternating current;
a sensing module, in communication with the sensor, to capture samples of the at least one property of the alternating current during an ON event; and
a computation module, in communication with the sensing module, to identify an electrical device using time domain and frequency analysis of the at least one property, wherein the computation module includes:
a training module having a training database module and a support vector machine classifier, and a classification module having a trained support vector machine classifier and a classification database.

2. The system of claim 1, wherein the sensing module includes:
a data acquisition module,
a peak detect filtering module, and
an event detection module.

3. The system of claim 2, wherein the data acquisition module is to capture an alternating current line voltage signal and perform an analog-to-digital conversion of the signal.

4. The system of claim 2, wherein the peak detect filtering module is to compute a peak-to-peak voltage of the alternating current.

5. The system of claim 2, wherein the event detection module is to detect the ON event of the electrical device.

6. The system of claim 1, wherein the computation module further includes
a feature extraction module.

7. The system of claim 6, wherein the feature extraction module is to compute a feature vector including frequency domain features and time domain features.

8. The system of claim 1, wherein the training module is to train the support vector machine classifier.

9. The system of claim 8, wherein the training module uses a database of feature vectors for known devices to perform the training.

10. The system of claim 1, wherein the classification module maintains a database to receive and store feature vectors for unknown devices.

11. The system of claim 10, wherein the classification module uses a trained support vector machine classifier to perform the identifying of unknown devices using a feature vector as input.

12. A method, comprising:
capturing, via a sensing module, samples of at least one property of an alternating current during a transient event;
identifying, via a computation module in communication with the sensing module, an electrical device using time and frequency domain analysis of the at least one property;
training, via a training module having a training database module and a support vector machine classifier, a support vector machine classifier; and
identifying, via a classification module having a trained support vector machine classifier and a classification database, an unknown electrical device.

13. The method of claim 12, further comprising:
capturing, via a data acquisition module, a line voltage signal of the alternating current and performing an analog-to-digital conversion of the signal;
computing, via a peak detect filtering module, a peak-to-peak voltage of the alternating current; and
detecting, via an event detection module, the transient event of the electrical device.

14. The method of claim 12, further comprising:
computing, via a feature extraction module, a feature vector including frequency domain features and time domain features.

15. The method of claim 12, wherein the training module uses a database of feature vectors for known devices to perform the training.

16. The method of claim 12, wherein the classification module uses the trained support vector machine classifier to perform the identifying of unknown devices using a feature vector as input.

17. At least one non-transitory computer readable storage medium comprising a set of instructions which, if executed by a computing system, cause the computing system to:
capture samples of at least one property of an alternating current during an ON event,
identify an electrical device using time domain and frequency domain analysis of the at least one property,
train a support vector machine classifier, and
identify an unknown electrical device using the trained support vector machine classifier.

18. The at least one computer readable storage medium of claim 17, wherein the instructions, if executed, further cause a computing system to:
capture a line voltage signal of an alternating current,
compute a peak-to-peak voltage of the alternating current, and
detect an ON event of the electrical device.

19. The at least one computer readable storage medium of claim 17, wherein the instructions, if executed, further cause a computing system to
compute a feature set for the electrical device including frequency domain features and time domain features.

20. An apparatus, comprising:
a sensing module to detect samples corresponding to at least one property of an alternating current of a leg in an electrical system during an ON event; and
a computation module, in communication with the sensing module, to identify an electrical device by time domain analysis and frequency domain analysis of the at least one property, wherein the computation module includes:
a training module having a training database module and a support vector classifier; and
a classification module having a trained support vector machine classifier and a classification database.

21. The apparatus of claim 20, wherein the sensing module includes:
a data acquisition module,
a peak detect filtering module, and
an event detection module.

22. The apparatus of claim 21, wherein:
the data acquisition module is to capture a line voltage signal of an alternating current and perform an analog-to-digital conversion of the signal,
the peak detect filtering module is to compute a peak-to-peak voltage of the alternating current, and
the event detection module is to detect the ON event of the electrical device.

23. The apparatus of claim 20, wherein the computation module further includes
a feature extraction module.

24. The apparatus of claim 23, wherein:
the feature extraction module is to compute a feature vector including frequency domain features and time domain features,
the training module is to train the support vector machine classifier, and
the classification module is to identify an unknown electrical device using the trained support vector machine classifier.

* * * * *